United States Patent [19]
Andris et al.

[11] Patent Number: 5,955,119
[45] Date of Patent: Sep. 21, 1999

[54] CARBIDE ROD SCREENING NOZZLES

[75] Inventors: Gerald Stanley Andris, Poughkeepsie; Yves Darves-Bornoz, Hague, both of N.Y.

[73] Assignee: International Business Machines Corporation, Armonk, N.Y.

[21] Appl. No.: 07/631,540

[22] Filed: Dec. 21, 1990

[51] Int. Cl.[6] .......................... B29C 47/14; B29C 65/00
[52] U.S. Cl. ........................................ 425/461; 264/241
[58] Field of Search ...................... 425/183, 461, 425/466; 29/890.142, 890.143; 264/241

[56] References Cited

U.S. PATENT DOCUMENTS

| | | | |
|---|---|---|---|
| 3,384,931 | 5/1968 | Cochran et al. | 425/128 |
| 3,694,120 | 9/1972 | Walton | 425/466 X |
| 4,066,821 | 1/1978 | Cook et al. | 427/249 X |
| 4,245,273 | 1/1981 | Feinberg et al. | 361/382 |
| 4,411,614 | 10/1983 | Feathers | 425/461 X |
| 4,522,776 | 6/1985 | Ramamurthy | 425/461 X |
| 4,544,341 | 10/1985 | Gnadig et al. | 425/461 X |
| 4,698,192 | 10/1987 | Kuze et al. | 264/101 |
| 4,808,435 | 2/1989 | Cropp et al. | 427/97 |
| 4,843,692 | 7/1989 | Hemmat | 29/890.142 X |
| 4,963,309 | 10/1990 | Gohlisch et al. | 425/466 X |

FOREIGN PATENT DOCUMENTS

| | | | |
|---|---|---|---|
| 2614504 | 10/1977 | Germany | 425/461 |

OTHER PUBLICATIONS

"Screen Printing with Non–Line Contact"; IBM Technical Disclosure Bulletin; Brilla et al.; vol. 25, No. 6; Nov. 1982.

*Primary Examiner*—Richard L. Chiesa
*Attorney, Agent, or Firm*—Whitham, Curtis & Whitham; Steven J. Soucar

[57] ABSTRACT

A degradation resistant nozzle for a screening, extrusion or similar processes has a tip surface formed by one or more rods of a material having an increased hardness relative to the body portion of the nozzle. The rods are preferably of circular cross-section and formed of tungsten carbide. The rods are removably attached in preferably circular grooves in the tip of the nozzle body. The removability of the rods facilitates reworking of the nozzle when wear occurs since new rods can quickly and inexpensively be substituted. The degradation resistant nozzle also decreases wear and scoring of stencils used in screening processes and thus increases the useful life thereof.

21 Claims, 2 Drawing Sheets

WIDE PRESSURE ANGLE

NARROW PRESSURE ANGLE
TANGENT CONTACT

TAPER

CARBIDE ROD SCREENING NOZZLES

BACKGROUND OF THE INVENTION

1. Field of the Invention

The present invention generally relates to nozzles for the extrusion of materials and/or application of materials to surfaces and, more particularly, to nozzles for applying a conductive paste to surfaces of substrates to form interconnection boards in a thick film deposition process.

2. Description of the Prior Art

In the construction of electrical devices, the structures for assembling circuit elements into functional groups and the packaging and structural support of such functional groups of circuit elements often constitutes a major portion of the cost of a manufactured electronic device or component therefore. With increased complexity of individual circuit elements and manufactured devices, in general, has come an increased complexity of interconnection structures such as printed circuit boards using, for instance, epoxy and fiberglass substrates. Increased circuit element density as well as integration density has increased heat tolerance and dissipation requirements of these interconnection elements as well as the use of multi-layer boards.

A high-performance structure now in widespread use is the multi-layer ceramic (MLC) type of interconnection structure, described in U.S. Pat. No. 4,245,273, to Feinberg et al., for PACKAGE FOR MOUNTING AND INTERCONNECTING A PLURALITY OF LARGE SCALE INTEGRATED SEMICONDUCTOR DEVICES, assigned to the assignee to the present invention, and hereby incorporated by reference herein. In these structures, a potentially differing interconnection pattern is formed on each of a multiplicity of layers of ceramic substrate. These interconnection patterns include perforations, known as vias, in the ceramic carriers which are selectively filled with conductive paste and provide electrical continuity between layers of the MLC structure. The respective layers are then stacked and sintered under pressure and high temperature to provide a unitary structure with many interconnection lamina embedded therein to allow formation of electronic interconnection structures of high connection complexity. However, testing of each layer as it is formed requires a number of steps at least corresponding to the number of layers and an equal number of geometrical setups to allow testing by automated machinery. For this reason, it is common to optically inspect each layer as it is formed and to test only a portion of each layer for circuit continuity to some degree of confidence. Full electrical continuity is only tested a single time after the entire multi-layer ceramic (MLC) structure is assembled and sintered. This final test would also be required even if the individual layers were individually fully tested, since the electrical connection patterns can be damaged by either of the assembly and sintering steps of the process. Therefore, to achieve reasonably high manufacturing yields it is particularly necessary to form the individual layer by techniques which are productive of extremely low incidence of defects. The conductive patterns must also be formed with high regularity and consistency to reduce susceptibility to the formation of defects during assembly and sintering.

The formation of the conductive patterns on the individual substrate layers is done by assembling a stencil on the substrate, applying a layer of conductive paste and then removing the stencil. This process in commonly known as screening. Once the pattern is initially formed, other processing steps, such as drying, may also be employed to stabilize the pattern during assembly. Then the layers are assembled and, typically, sintered, as indicated above.

The use of a stencil and the fineness of typical interconnection patterns requires a reasonably high pressure to be developed for the application of the conductive paste. At one time, the layer of conductive paste was typically applied by means of a TEFLON™ (polytetrafloroethylene) squeegee. As conductive patterns increased in complexity, however, a squeegee was not able to develop sufficient pressures to reliably penetrate the stencils with the conductive paste to form the desired interconnection patterns and to reliably fill the via perforations in the ceramic carriers. Accordingly, it is presently deemed desirable to apply the conductive paste with a nozzle which confines the conductive paste against the substrate and allow the production of a uniform layer on the substrate and full stencil penetration. A description of a screen printing method for forming MLC structures using a nozzle is described in U.S. Pat. No. 4,808,435, to Cropp et al., assigned to the Assignee of the present invention and which is hereby incorporated by reference.

Since a substantial pressure is applied to the paste in the screen printing process, it is necessary to apply an adequate force to the nozzle to press the nozzle against the stencil in order to confine the paste and maintain the paste pressure. This pressure of the nozzle against the stencil, which is typically formed of a nickel sheet, results in friction as the nozzle is moved relative to the stencil. The friction against the stencil also causes wear of the nozzle and, for that reason, it is desirable that the nozzle have a surface which is resistant to abrasion. A nozzle formed of Tungsten Carbide is disclosed SCREENING NOZZLE WITH NON-LINE CONTACT by R. C. Brilla et al. in IBM Technical Bulletin, Vol. 25, No. 6, November 1982, which is also incorporated by reference, herein. This publication also addresses the issue of nozzle profile in order to maintain confinement of the paste where the stencils have relatively coarse features relative to the area of nozzle contact with the stencil.

This potential problem can also be solved in the manner disclosed in U.S. Pat. No. 3,384,931, to Cochran et al., assigned to the assignee of the present invention and also incorporated by reference, using a more complex stencil structure. In this latter method and apparatus, the stencil is fabricated in a manner where the stencil features are formed on only one side of the stencil and the stencil is perforated by many tiny apertures to allow penetration of the paste to the stencil feature area and escape of air from the volume formed by the stencil feature. This stencil structure and technique cause a point contact of the nozzle with the stencil to be preferred. A point contact allows a narrow pressure angle to be formed by essentially tangent contact between the nozzle and the stencil to increase effective screening pressure. The viscosity of the conductive paste effectively maintains pressure of the paste as the stencil features are filled and no further air is present in the stencil feature.

This latter method of screening and stencil structure is presently preferred. The more complex stencil structure, however, makes it desirable that wear and scoring of the stencil be minimized. To a certain degree, stencil degradation is reduced by the point contact of the nozzle. However, as the nozzle itself becomes worn or otherwise degraded due to both friction with the stencil and interaction with the conductive paste, the nozzle profile becomes more flat and the contact area becomes wide; increasing the tendency for scoring of the stencil to occur.

To maximize stencil life, a rework limit has been established for the nozzles to control the screened line dimension, scoring levels and pattern quality. When a nozzle profile reaches a predetermined dimension of flat surface, the nozzle is reworked to obtain a round profile and then reused.

However, during nozzle degradation, a significant amount of scoring of the stencils nevertheless occurs; resulting in scrapping of a stencil typically after much less than two thousand passes.

The short useful life of the stencils as well as the complexity thereof significantly increases the cost of the screening process and less than optimum screened pattern quality. In addition, the substrate or carrier can become contaminated by metal shavings resulting from the scoring. In this regard, it has been found that tungsten carbide resists picking up materials from the mask or stencil which may cause scoring. Scoring also degrades the screening process since it degrades the tightness with which the nozzle fits against the stencil and causes smearing of the conductive paste as well as potential loss of pressure.

Although, as pointed out above, tungsten carbide has been proposed for use in some nozzles having a flat profile, the manufacture of nozzles from this material is expensive. Therefore, it has been deemed preferable to fabricate the nozzles from steel. As an enhancement to the steel nozzle, a tungsten carbide coating has been applied to the steel of the nozzle tip by flame spraying. However, it was found that during thick film deposition, the carbide coating would disintegrate, resulting in the original nozzle structure. The nozzle rework loop in the thick film process was also expensive because of the step of rejuvenating the carbide coating.

Accordingly, there is a need in the thick film deposition process and other coating, extrusion and screening processes, for a nozzle structure which is of reduced expense to manufacture and use and which would resist degradation by having a tip construction which is of a material much harder than the paste constituents and the stencil material but which would be smooth and resist collection of material from the stencil in order to achieve increased mask or stencil pass factors and decreased nozzle rework levels and expense.

SUMMARY OF THE INVENTION

It is therefore an object of the present invention to provide a nozzle structure which improves process throughput by reducing the need for nozzle rework to maintain nozzle profile.

It is another object of the invention to provide a nozzle which allows improved pattern quality and improved consistency in pattern quality in coating and/or extrusion processes, including reliable filling of vias in the ceramic carrier.

It is a further object of the invention to provide a nozzle which reduces the risk of contamination of the carrier with materials from the nozzle or stencil.

It is yet another object of the invention to provide a nozzle which will allow increased pass factors and useful stencil life.

It is another further object of the invention to provide a nozzle structure and methods of manufacture and reworking of the nozzle which are less costly and require less time to rework in order to reduce the contribution of nozzle-associated costs, as well as reducing stencil-associated costs, to the overall coating or extrusion process.

To achieve the above and other objects of the invention, a nozzle structure is provided including a body portion having at least one groove formed at a tip thereof and at least one rod retained in the groove in the body portion.

In accordance with another aspect of the invention, a method is provided for making or reworking a nozzle having a tip suitable for a screening or extrusion process, including a step of attaching at least one tungsten carbide rod to a recess formed in the nozzle tip.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
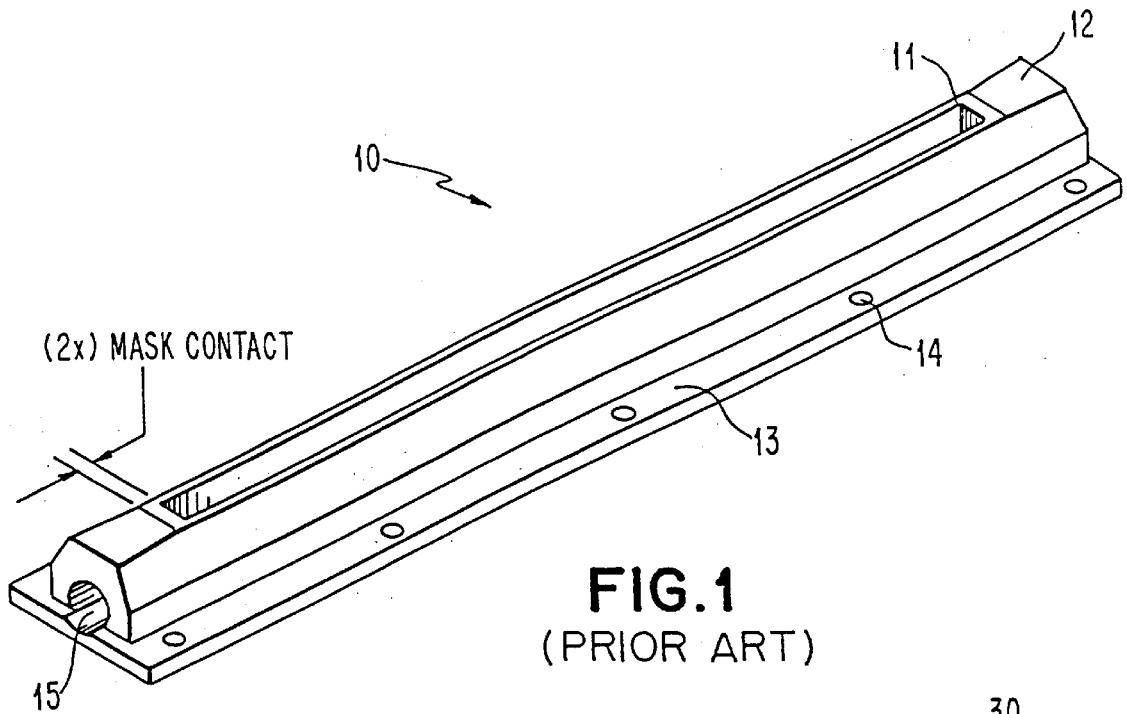
FIG. 1 is an isometric view conventional screening or extrusion nozzle.

Referring now to the drawings, and more particularly to FIG. 1, there is shown a view of a screening nozzle 10 according to the prior art. The screening nozzle is formed in a nozzle blank having a generally rectangular surface 11 surrounding a generally rectangular aperture through which material is forced. The nozzle may have a flange 13 and attachment holes 14 or some other form of attachment means for attaching the nozzle to a material reservoir or other part of the apparatus. Material can also be provided to the nozzle through an opening or openings in the rear side of the nozzle (not shown). Opening 15 in the nozzle blank is provided to receive a valve structure (not shown) in the form of a slotted cylinder which may be rotated to control the flow of conductive paste or other material to be extruded or applied from the nozzle.

Figure 2:
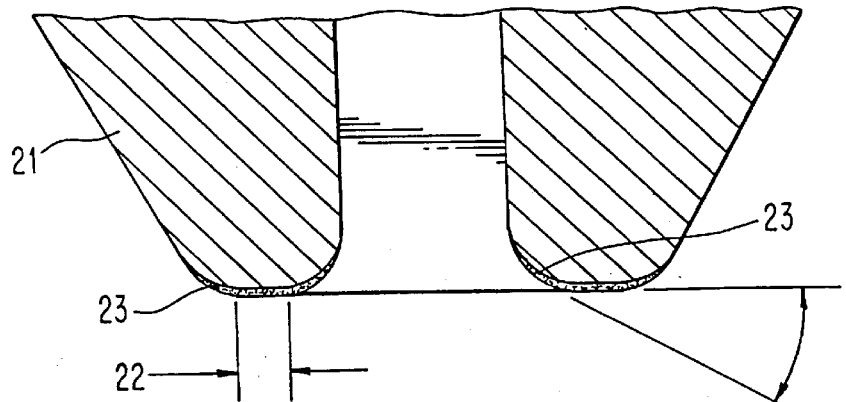
FIG. 2 is a cross-sectional view of the profile of the nozzle of FIG. 1.

FIG. 2 shows a cross-section of the nozzle illustrated in FIG. 1. The body 21 of the nozzle generally tapers outwardly away from the nozzle tip. the nozzle opening can be formed with generally parallel sides, as shown or can be tapered, preferably outwardly away from the opening to reduce pressure drop due to the viscosity of the material to be applied. The flat portion of surface 11 is shown at 22. The flat portion may initially be formed to have a circular profile, but, as pointed out above, will rapidly assume the profile shown due to wear. Also as pointed out above, this prior art nozzle can be enhanced and wear initially reduced by the provision of a tungsten carbide coating 23. Finally, the prior art nozzle has ends which are tapered away from the carrier surface to reduce mask contact at the ends of the nozzle.

It is important to note from FIG. 2 that even extremely small amounts of wear will result in a large pressure angle which will reduce the amount of increased pressure can be additionally produced by shear forces on the viscous fluid as the nozzle is passed over the carrier. It is also important to note that the nozzle is of a one piece construction and a reshaping of the profile of the nozzle to eliminate the effects of wear requires machining of the nozzle over its entire opening length. Such a machining operation is particularly difficult at the ends of the opening. Further, if a carbide coating is used, it must be renewed by the application of a further amount of tungsten carbide after the machining process is completed. This deposition is typically done by a flame sprayed process. Since deposition of addition material could be irregular, a further machining process could be required to bring the tungsten carbide into the proper shape. Therefore, the reworking of the prior art nozzle requires a minimum of three processing steps, each of which is difficult and requires expensive apparatus to perform.

Figure 3:
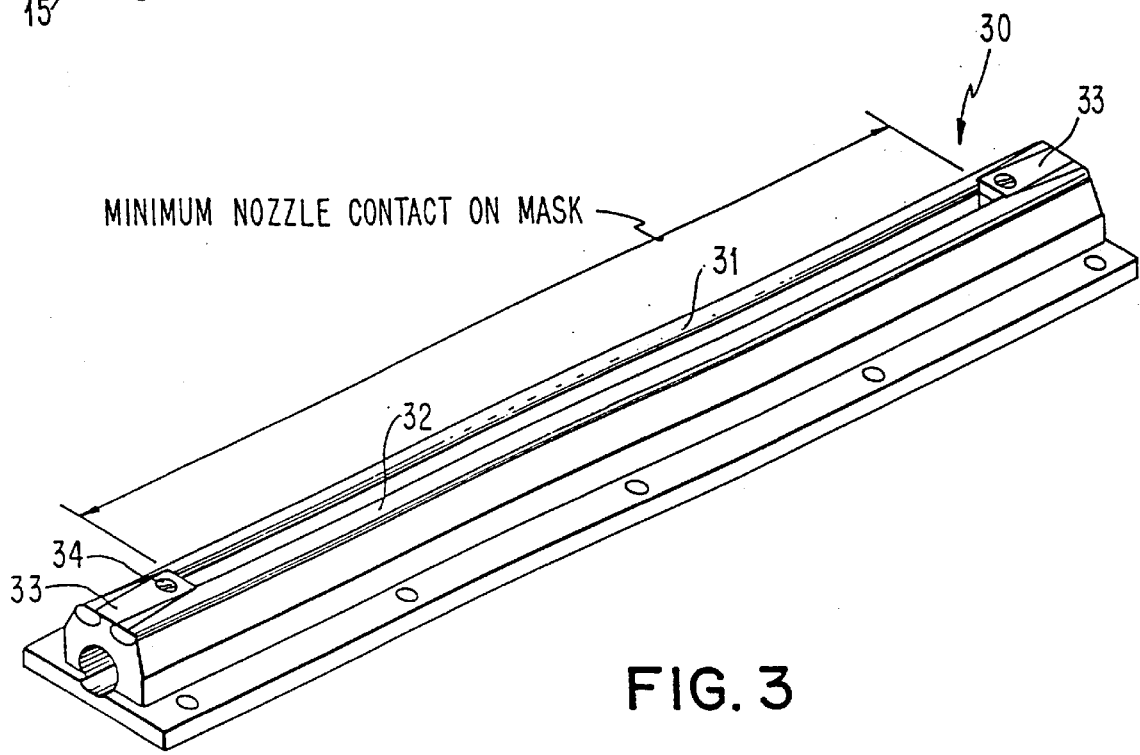
FIG. 3 is an isometric view of a nozzle according to the invention.
Figure 5:
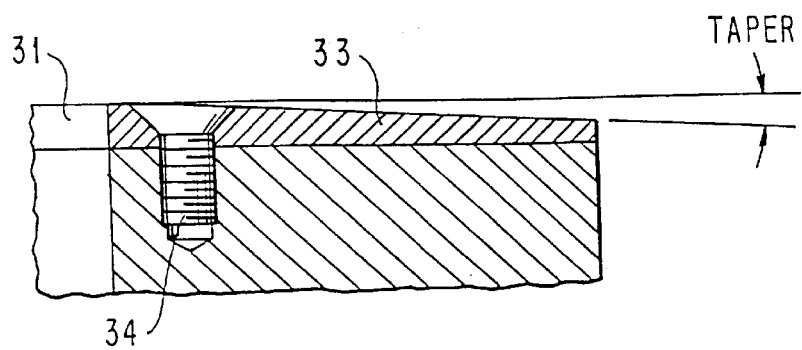
FIG. 5 is a cross-sectional view of an end of the nozzle of FIG. 3, illustrating one form of rod retainer in accordance with an embodiment of the invention.

In contrast, in the present invention, as illustrated in FIG. 3, the major sides of the elongated nozzle opening in the nozzle blank forming the nozzle body portion are formed by rods 31, 32 which are preferably made of tungsten carbide. According to one embodiment of the invention, the rods can be retained in grooves formed in the nozzle blank by means of tapered inserts 33 provided at both ends of the nozzle. This tapered insert can be attached to the nozzle body portion by screws 34 or other fastening means. It should be noted that the tapered inserts, if used, also provide a seal for confining, at the ends of the nozzle, the material to be applied as shown in FIG. 5.

Figure 4:
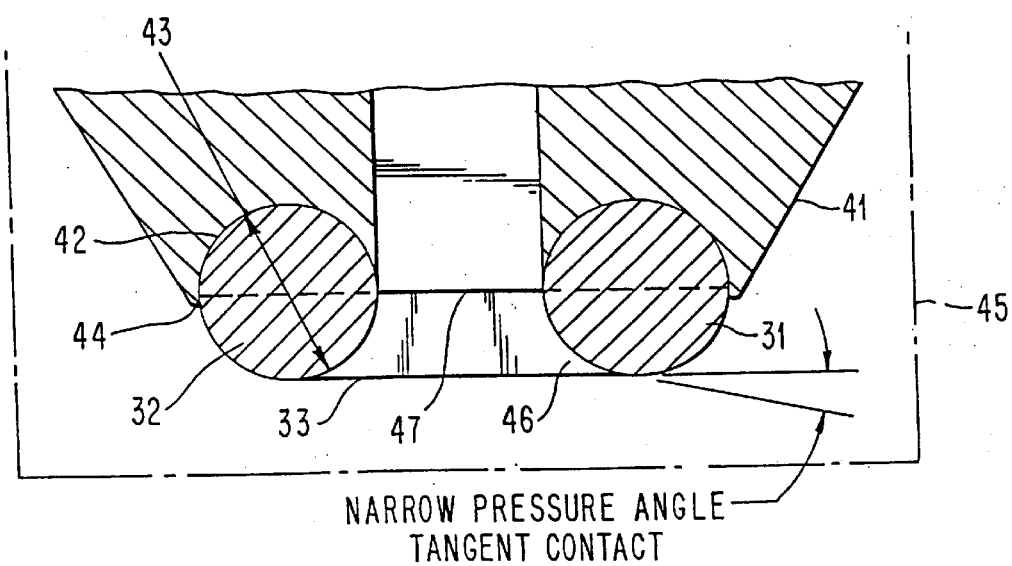
FIG. 4 is a cross-sectional view of the profile of the nozzle of FIG. 3.

The grooves 42, shown in FIG. 4, in the nozzle blank which receive the rods are preferably formed by electro-discharge machining of the nozzle tip. The grooves have a pretermined shape to conform to a portion of the rod shape, preferably as an arc of a circle closely matching the circumference of the rod. It should be noted from FIG. 4 that the machining of the nozzle tip will preferably form a plane at line 47 and circular grooves to receive the rod. However, this machining process preferably leaves regions 44, slightly raised from the plane at line 47 and beyond the diameter 43 of the rods (e.g. slightly beyond one-half the circumference of the rod) so that the rods can be conveniently press fitted into the grooves with little force and retained in that position while the tapered inserts, rod retaining plates or other rod retaining means can be installed.

Alternatively, grooves can be formed by drilling a block of material generally indicated by dotted line 45 and the remainder of the nozzle body formed thereafter. If this alternative is adopted, material corresponding to the retaining means 33 can be left on the nozzle blank and the rods assembled onto the nozzle body portion by being inserted axially into the holes and thus retained by the end portions or the rods can be shortened and press fitted into the grooves as described above. In any of these assembly methods, but particularly in the last-mentioned assembly method, the rods may be glued in place with a releasable adhesive. Of course, more than one retaining means can be used concurrently in the nozzle structure.

At the present time an epoxy adhesive is preferred and release of the glue joint at 42 of FIG. 4 can be achieved by chemically dissolving the adhesive by soaking in perchlorethylene. Heating can also enhance this dissolution process. Alternatively, a cyano-acrylate type of adhesive can be employed and release caused by application of heat. Either of these types of adhesive and others may be advantageously used depending on the temperature at which the screening takes place and the solvents used in the material to be applied. Since the exemplary thick film deposition process described above is performed essentially at room temperature, a wide variety of adhesives are possible. Depending on the rod shape chosen and the nature of other retaining means concurrently used, it is desireable that the adhesive have substantial strength in shear. Adhesives having a pronounced differential strength between the shear and tension directions may be of particular utility in the practice of this invention.

It should also be noted that the above methods of forming grooves 42 are preferred because of the high dimensional accuracy which they provide. If such high accuracy is not required, for instance, in applications where pressures are relatively low, lower dimensional tolerances may be acceptable and the grooves could be formed by grinding or molding or other techniques.

Other types of retaining means or methods, such as burnishing a small portion of material around part of the rod circumference, can also be employed within the scope of the invention as long as they allow for relatively simple releasing of the rods. This feature is significant to the invention since, when wear occurs, the nozzle can be reworked simply by removing the worn rods and inserting new rods with no machining steps whatever. Since tungsten carbide rods are readily available with accurate diameters and a surface smoothness (e.g. 0.00002 to 0.00005 inches) which is sufficient for this application of the invention, the nozzle structure of the invention provides a nozzle which can be fully renewed with minimal effort and equipment.

As a final step of either manufacture or reworking of the nozzle, the ends of the carbide rods should be tapered to the contour of the tapered insert, if used, as shown in FIG. 5, or the nozzle body portion. This provides a relief beyond the nozzle opening to avoid friction against the mask or other surface to which material is applied. Since this tapering is only for the purpose of reducing contact area, precision is not particularly important and the tapering of the tungsten carbide rods can be accomplished by grinding or any of a variety of other techniques It should also be noted that the ease of replacement of the rods allow other, less durable, materials to be used for the rods. For instance, the rods could be of the same material as the nozzle body portion and although they would require frequent replacement, the nozzle could still be fully renewed while maintaining an advantage over the prior art of avoiding machining steps in the reworking process. Other materials different from tungsten carbide may also be advantageous depending on the material and application with the only constraint being that the rod material should have a somewhat greater hardness than the mask or stencil material.

In view of the foregoing, it is seen that the invention provides a nozzle while can be easily renewed without machining and which has an improved resistance to degradation, depending on the rod material. By maintaining accurate and consistent geometry, high quality screening can be done, improving manufactured device yields with minimal wear or scoring of the masks or stencils used, even at high pass factors. The invention has been employed in screening processes with no substantial scoring of stencils or contamination of carriers at mask pass factors more than 35% greater than the prior art. This allows well in excess of two thousand screening passes to be made without visible scoring of the stencil or mask. Nozzles in accordance with the invention are less expensive to produce and to maintain and require rework only infrequently and, then, by a simple and inexpensive process.

While the invention has been described in terms of a single preferred embodiment, those skilled in the art will recognize that the invention can be practiced with modification within the spirit and scope of the appended claims. For instance, while circular cross-sectional shapes of the rods as disclosed above are preferred and readily available, other shapes which may be, additionally, keyed into the nozzle body portion or which may be desireable to obtain or maintain a particular pressure angle may also be used within the scope of the present invention.

Having thus described my invention, what I claim as new and desire to secure by Letters Patent is as follows:

1. A method of making a nozzle having a tip including a step of attaching at least one rod to a groove formed in said nozzle tip, and adhering said rod to said nozzle tip with an adhesive.

2. A method as recited in claim 1, wherein said attaching step includes clamping said rod to said nozzle tip with a plate engaging at least one end portion of said rod.

3. A method as recited in claim 1, wherein said adhesive is a releasable adhesive.

4. A method as recited in claim 1, wherein said adhesive is an epoxy adhesive.

5. A method as recited in claim 1, wherein said recess groove in said nozzle tip is formed by electro discharge machining.

6. A method as recited in claim 1, wherein said recess groove in said nozzle tip is formed by drilling.

7. A method as recited in claim 1, wherein said recess groove in said nozzle tip is formed by at least one of grinding or casting.

8. A method of reworking a nozzle having a tip including at least one rod carried in a groove in said tip of said nozzle, said method including steps of removing said at least one rod from said groove, attaching at least one rod to said groove formed in said nozzle tip, and adhering said rod to said nozzle tip with an adhesive.

9. A method as recited in claim 8, wherein said attaching step includes clamping said rod to said nozzle tip with a plate engaging at least one end portion of said rod.

10. A method as recited in claim 8, wherein said adhesive is a releasable adhesive.

11. A method as recited in claim 8, wherein said adhesive is an epoxy adhesive.

12. A nozzle structure including a body portion having at least one groove formed at a tip thereof, at least one rod attached to said groove in said body portion, wherein said rod is a tungsten carbide rod.

13. A nozzle structure as recited in claim 12, further including a retainer means for retaining said rod in said groove in said body portion.

14. A nozzle structure as recited in claim 13, wherein said retainer means is a retainer plate for clamping a tapered end portion of said rod against said body portion.

15. A nozzle structure as recited in claims 13, wherein said retainer means is and adhesive means for adhering said rod to said body portion.

16. A nozzle structure as recited in claim 15, wherein said adhesive means is an epoxy adhesive.

17. A nozzle structure as recited in claim 12, wherein said rod has a circular cross-section.

18. A nozzle structure as recited in claim 12, wherein said tungsten carbide rod has a circular cross-section.

19. A nozzle structure as recited in claim 12, wherein said rod is releasably retained in said groove.

20. A nozzle structure including a nozzle body portion having an elongated opening in a tip thereof and at least one groove having a predetermined cross-sectional shape formed adjacent a major side of said elongated opening, at least one rod, having a share conforming, in part, to said predetermined cross-sectional shape of said groove, said at least one rod being located in said at least one groove, means for attaching said at least one rod to said at least one groove, wherein said predetermined cross-sectional shape is an arc of a circle, and wherein said rod has a circular cross-sectional shape having a circumference and said arc of said circle extends beyond one-half of said circumference.

21. A nozzle as recited in claim 20, wherein said means for attaching said rod in said groove comprises at least an adhesive between said rod and said nozzle body portion.

\* \* \* \* \*